United States Patent
Pyeon et al.

(10) Patent No.: US 9,836,391 B2
(45) Date of Patent: *Dec. 5, 2017

(54) SYSTEM AND METHOD OF PAGE BUFFER OPERATION FOR MEMORY DEVICES

(71) Applicant: CONVERSANT INTELLECTUAL PROPERTY MANAGEMENT INC., Ottawa (CA)

(72) Inventors: Hong Beom Pyeon, Kanata (CA); Jin-Ki Kim, Kanata (CA); HakJune Oh, Kanata (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 27 days.

This patent is subject to a terminal disclaimer.

(21) Appl. No.: 14/457,567

(22) Filed: Aug. 12, 2014

(65) Prior Publication Data

US 2015/0046639 A1 Feb. 12, 2015

Related U.S. Application Data

(63) Continuation of application No. 13/302,413, filed on Nov. 22, 2011, now Pat. No. 8,843,694, which is a continuation of application No. 11/822,496, filed on Jul. 6, 2007, now Pat. No. 8,086,785.

(60) Provisional application No. 60/891,115, filed on Feb. 22, 2007.

(51) Int. Cl.
*G06F 12/02* (2006.01)
*G06F 12/0893* (2016.01)
*G11C 7/10* (2006.01)

(52) U.S. Cl.
CPC ...... *G06F 12/0246* (2013.01); *G06F 12/0893* (2013.01); *G11C 7/106* (2013.01); *G11C 7/1039* (2013.01); *G11C 7/1087* (2013.01); *G06F 2212/1044* (2013.01); *G06F 2212/2022* (2013.01); *G06F 2212/3042* (2013.01); *G06F 2212/7203* (2013.01); *G06F 2212/7208* (2013.01); *G11C 2207/2245* (2013.01)

(58) Field of Classification Search
CPC ......... G06F 12/0246; G06F 2212/7203; G06F 2212/7208; G06F 2212/3042; G11C 7/106; G11C 7/1087
See application file for complete search history.

(56) References Cited

U.S. PATENT DOCUMENTS

| | | | | |
|---|---|---|---|---|
| 8,086,785 B2 * | 12/2011 | Pyeon | .............. | G06F 12/0893 710/52 |
| 8,843,694 B2 * | 9/2014 | Pyeon | .............. | G06F 12/0893 710/52 |
| 2002/0124129 A1 * | 9/2002 | Zilberman | .......... | G06F 13/1673 711/103 |
| 2006/0198202 A1 * | 9/2006 | Erez | .................... | G11C 11/005 365/185.29 |

* cited by examiner

*Primary Examiner* — Edward Dudek, Jr.
(74) *Attorney, Agent, or Firm* — Conversant IP Management Corp.

(57) ABSTRACT

Systems and methods are provided for using page buffers of memory devices connected to a memory controller through a common bus. A page buffer of a memory device is used as a temporary cache for data which is written to the memory cells of the memory device. This can allow the memory controller to use memory devices as temporary caches so that the memory controller can free up space in its own memory.

16 Claims, 8 Drawing Sheets

SYSTEM AND METHOD OF PAGE BUFFER OPERATION FOR MEMORY DEVICES

CROSS REFERENCE TO RELATED APPLICATIONS

This application is a continuation of U.S. patent application Ser. No. 13/302,413 filed Nov. 22, 2011, which is a continuation of U.S. patent application Ser. No. 11/822,496 filed Jul. 6, 2007, now U.S. Pat. No. 8,086,785 which issued on Dec. 27, 2011, which claims the benefit of prior U.S. Provisional Patent Application No. 60/891,115 filed on Feb. 22, 2007, the disclosures of which are hereby incorporated by reference in their entirety.

FIELD OF THE INVENTION

The present invention relates generally to memory systems. More particularly, the present invention relates to an apparatus and a method for controlling a plurality of memory devices.

BACKGROUND OF THE INVENTION

Electronic equipment uses memory devices, for example, flash memories, for storing data or information. In a memory system, a memory controller programs a selected flash memory device by loading data to a page buffer of the selected flash memory device.

United States Patent Application No. 2006/0198202 A1 published Sep. 7, 2006 discloses a flash memory system including a flash controller for controlling operation of multiple flash memory devices. One page buffer allocated within one flash device functions as a designated target buffer. Another page buffer allocated within another flash device functions as a mirror buffer. The flash controller transmits the page data to the two flash devices simultaneously and the same data is stored in the two page buffers. Thus, no data backup is required to be kept in the flash controller.

SUMMARY OF THE INVENTION

According to a broad aspect of the invention, there is provided a method for controlling a memory device connected with a controller, the device having a page buffer and memory cells, the controller having a data storage, the method comprising: writing data from the data storage of the controller to the page buffer of the device; and reading back the data at a later time from the page buffer of the device to the data storage of the controller, before programming the data from the page buffer into the memory cells of the device.

In some embodiments, a data load command and data are provided to the memory device which is enabled. In response to a command strobe, the data is transmitted from the data storage of the controller to the device, the page buffer of which stores the transmitted data. Before the stored data in the page buffer of the device is programmed into the memory cells of the device, the data is read back at a later time from the page buffer to the data storage of the controller.

Advantageously, the space in the data storage where the data is occupied may be freed up, upon writing the data from the data storage of the controller to the page buffer of the designated device.

According to another broad aspect of the invention, there is provided a method for controlling a plurality of devices connected with a controller through a common bus, each of the devices having a page buffer and memory cells, the controller having a data storage, the method comprising: writing data from the data storage of the controller to the page buffer of a designated device; and reading back the data at a later time from the page buffer of the designated device to the data storage of the controller, before programming the data from the page buffer into the memory cells of the designated device.

According to another broad aspect of the invention, there is provided an apparatus for controlling a plurality of devices connected with a common bus, each of the devices having a page buffer and memory cells, the apparatus having a data storage, the apparatus being capable of: writing data from the data storage to the page buffer of a designated device; and reading back the data at a later time from the page buffer of the designated device to the data storage, before programming the data from the page buffer into the memory cells of the designated device.

According to another broad aspect of the invention, there is provided a system comprising: a plurality of devices connected with a common bus, each of the devices having a page buffer and memory cells; and a memory controller for controlling the plurality of devices, the memory controller being capable of: writing data from a data storage of the controller to the page buffer of a designated device; and reading back the data at a later time from the page buffer of the designated device to the data storage of the controller, before programming the data from the page buffer into the memory cells of the designated device.

In some embodiments, each of the plurality of devices comprises flash memory devices.

BRIEF DESCRIPTION OF THE DRAWINGS

Embodiments will now be described with reference to the attached drawings in which.

DETAILED DESCRIPTION

Figure 1:
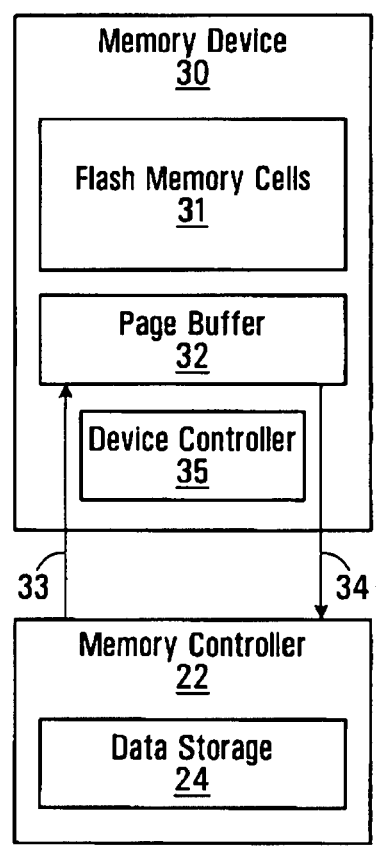
FIG. 1 is a block diagram of a memory system according to an embodiment of the present invention.

In the following detailed description of sample embodiments of the invention, reference is made to the accompanying drawings which form a part hereof, and in which is shown by way of illustration specific sample embodiments in which the present invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined by the appended claims.

In a memory system including, for example, flash memory devices, a read command to a flash memory device results in data being read from the flash memory cells to the page buffer and then transferred out of the page buffer. A write command to a flash memory device results in data being written to a page buffer, and then transferred from the page buffer to the flash memory cells. In some embodiments, this is achieved using some of the commands disclosed in U.S. Provisional Patent Application No. 60/839,329 "NAND Flash Memory Device" filed Aug. 22, 2006, which is hereby incorporated by reference in its entirety. U.S. Provisional Patent Application No. 60/892,705 "Modular Command Structure in Memory System and its Use" filed Mar. 2, 2007, which is hereby incorporated by reference in its entirety, discloses different command structures to distinguish core access operations that involve relatively long processing times from page buffer access operations that involve relatively short access times. The commands are "modular" because they allow separate access to the memory core and the page buffer. The core access commands and peripheral circuit including page buffer access commands are divided in the command definition. This allows for a "modular command system" enabling new uses for the page buffer of memory devices by accessing the page buffer independent of the program operation. This allows the page buffer to be used as a temporary cache for data.

For the purpose of allowing the page buffers to operate as temporary cache, for example, three "modular" memory devices access commands are used. The first is referred to as a "burst data load" command. This causes data to be written to the page buffer, but it is not then transferred to the flash memory cells. In the examples that follow, '4Xh' and '5Xh' are used for this, but more generally the command structure is defined on an implementation specific basis. The second is referred to as a "burst data read" command. This causes data to be read directly from the page buffer without first reading from the flash memory cells. In the examples that follow, '2Xh' is used for this, but more generally the command structure is defined on an implementation specific basis. The third is referred to as a "page program" command. This causes data that was previously stored in the page buffer to be written to the flash memory, destroying the contents of the page buffer in the process for verification purposes. In the examples that follow, '6Xh' is used for this, but more generally the command structure is defined on an implementation specific basis. Further details of example commands are provided in Table 1.

TABLE 1

| Command | OP Code (1 Byte) | Row Address (3 Bytes) | Column Address (2 Bytes) | Input Data (1 to 2112 Bytes) |
| --- | --- | --- | --- | --- |
| Page Read | 0Xh | Valid | — | — |
| Page Read for Copy | 1Xh | Valid | — | — |
| Burst Data Read | 2Xh | — | Valid | — |

TABLE 1-continued

| Command | OP Code (1 Byte) | Row Address (3 Bytes) | Column Address (2 Bytes) | Input Data (1 to 2112 Bytes) |
| --- | --- | --- | --- | --- |
| Burst Data Load Start | 4Xh | — | Valid | Valid |
| Burst Data Load | 5Xh | — | Valid | Valid |
| Page Program | 6Xh | Valid | — | — |
| Block Erase Address Input | 8Xh | Valid | — | — |
| Page-pair Erase Address Input | 9Xh | Valid | — | — |
| Erase | AXh | — | — | — |
| Operation Abort | CXh | — | — | — |
| Read Device Status | D0h | — | — | — |
| Read Device Information Register | F1h | — | — | — |
| Read Link Configuration Register | FEh | — | — | — |
| Write Link Configuration Register | FFh | — | — | Valid (1 Byte Only) |

Table I shows an example command set for flash memory with modular command in byte mode. Table 1 includes 14 commands: Page Read, Page Read for Copy, Burst Data Read, Burst Data Load Start, Burst Data Load, Page Program, Block Erase Address Input, Page-pair Erase Address Input, Erase, Operation Abort, Read Device Status, Read Device Information Register, Read Link Configuration Register, and Write Link Configuration Register. Each command has an Operation (OP) Code (1 Byte), a Row Address (3 Bytes), a Column Address (2 Bytes), and Input Data (1 to 2112 Bytes). In Table 1, 'X' is '0h' for "Bank 0". 'X' is '1h' for "Bank 1", for identifying the bank of a multiple bank memory.

FIG. 1 shows a memory system 20 according to an embodiment of the present invention. Referring to FIG. 1, the memory system 20 includes a memory controller 22 and a memory device 30 having a page buffer 32 that is used as a temporary cache for page read or other operations using cache function. The memory controller 22 has a data storage 24. The memory device 30 includes flash memory cells 31, the page buffer 32 and a device controller 35. The page buffer 32 is used as a temporary cache. The device controller 35 includes any appropriate circuitry for facilitating processing of commands issued by the memory controller 22.

In operation, the memory controller 22 can transmit data to the page buffer 32 without restriction to page programming. Data from the data storage 24 of the memory controller 22 is written to the page buffer 32 by a burst data load command ('4Xh' or '5Xh') as indicated at 33, and subsequently read by a burst data read command ('2Xh') as indicated at 34. Note that page programming is not performed. Therefore, the page buffer 32 can be accessed relatively quickly. In this manner, the page buffer 32 can be used as a temporary cache for data.

Figure 2:
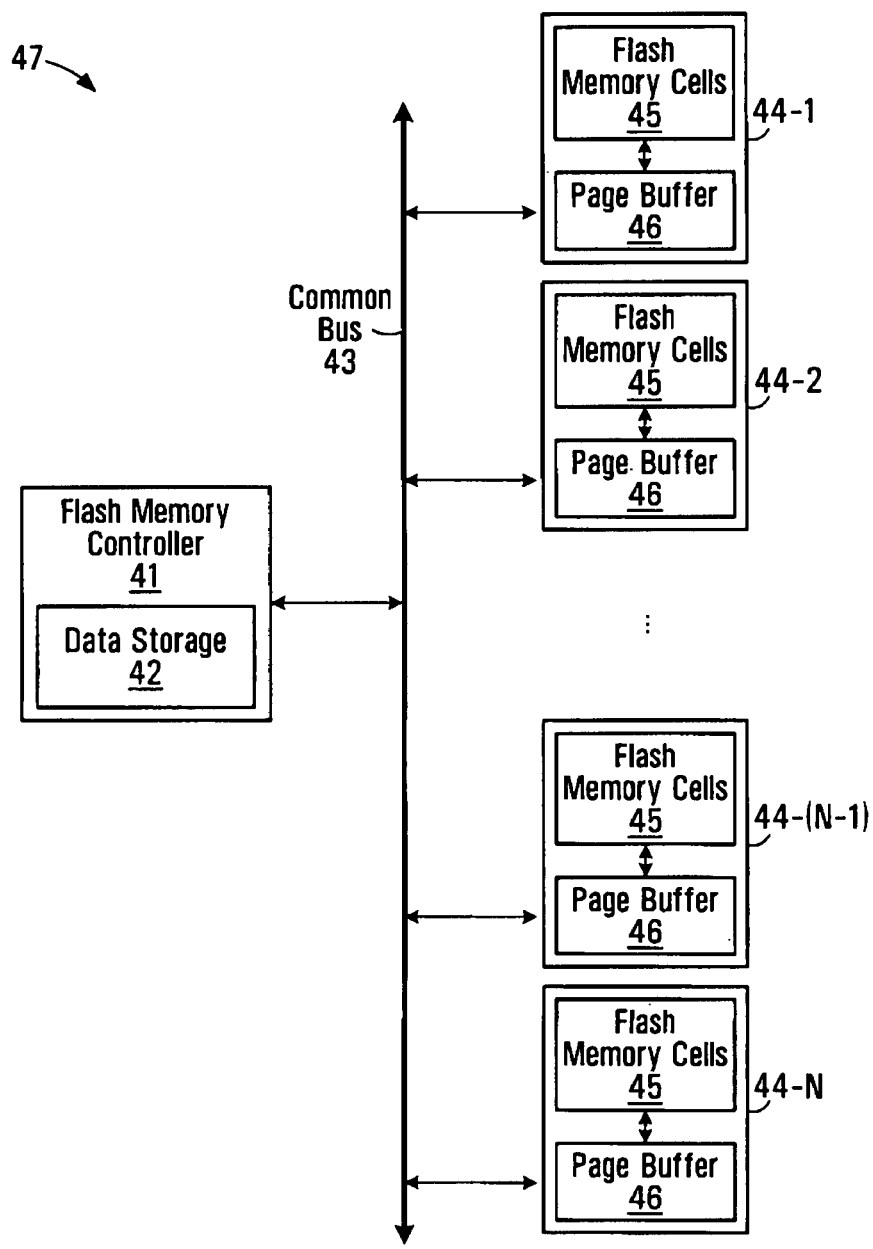
FIG. 2 is a block diagram of an example memory system having a multi-drop architecture to which embodiments of the present invention are applicable.

FIG. 2 shows an example memory system 47 having a multi-drop architecture. Referring to FIG. 2, the memory system 47 has a flash memory controller 41 and a plurality (N) of memory devices 44-1, 44-2, - - - , 44-(N−1) and 44-N connected via a common bus 43. N is an integer greater than one. The flash memory controller 41 has a data storage 42, which is, for example, an SRAM or any type of embedded memory. Each of the memory devices 44-1, 44-2, - - - , 44-(N−1) and 44-N has flash memory cells 45 and a page buffer 46.

Further details of how a page buffer can be used as a temporary cache for data are provided below.

An example command to send data from memory controller to a selected device without it automatically being written to the flash memory cells is "Burst Data Load ('4Xh' or '5Xh')". Using this command, any data that is to be held for some time while any operations based on flash commands are being executed in different devices can be transmitted to a selected device or devices. By this operation, the memory controller does not need to have several duplicated data storage elements to enhance the read and program performances. Examples are provided below for memory systems having a multi-drop architecture such as the memory system 47 shown in FIG. 2.

Figure 3:
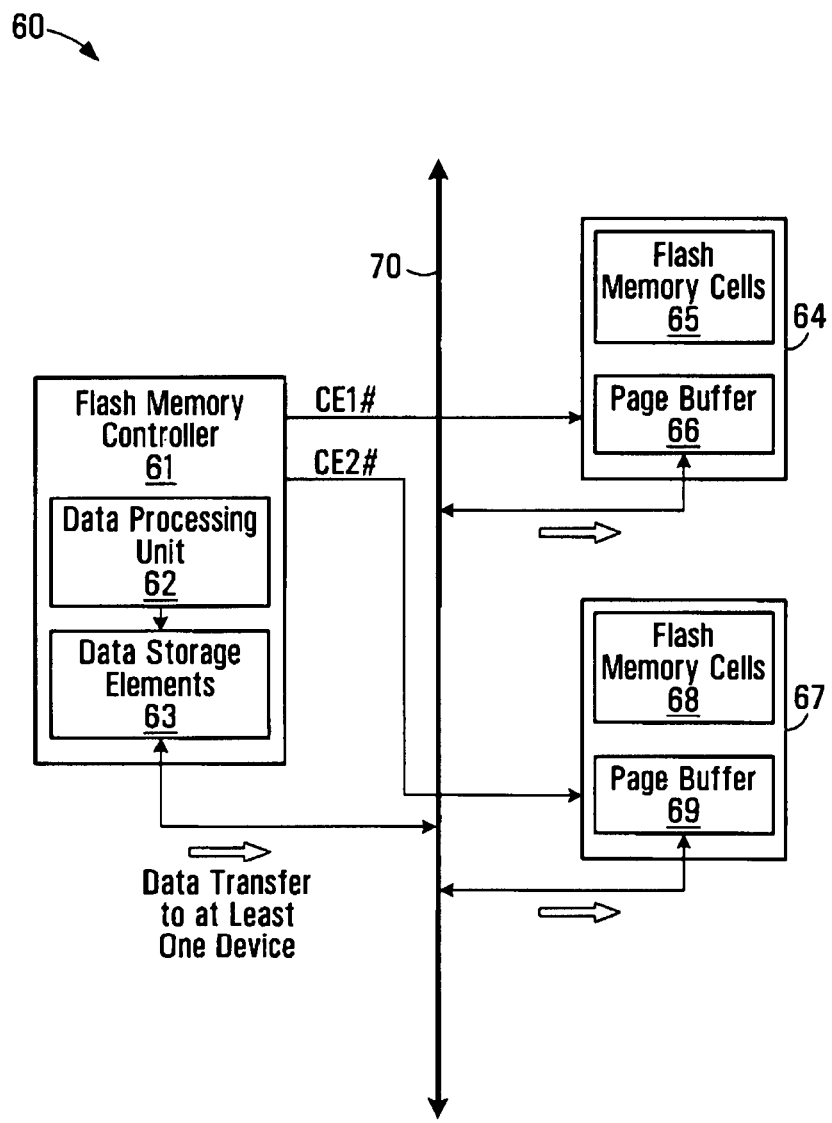
FIG. 3 is a block diagram of an example memory system having a multi-drop architecture in which a temporary cache function is performed.

FIG. 3 shows an example memory system 60 having a multi-drop architecture in which a temporary cache function is performed. In the particular example shown in FIG. 3, the memory system 60 includes a flash memory controller 61 and two memory devices 64 and 67. More generally, the number of memory devices is implementation specific. The flash memory controller 61 interconnects with the memory devices 64 and 67 via a common bus 70. The flash memory controller 61 has a data processing unit 62 and data storage elements 63. The memory device 64 has flash memory cells 65 and a page buffer 66. Similarly, the memory device 67 has flash memory cells 68 and a page buffer 69. In the memory system 60, a temporary cache function is performed.

In operation, the flash memory controller 61 transmits data from the data storage elements 63 to the page buffer of at least one designated device, which in the illustrated example happens to be the page buffers 66 and 69 of the memory devices 64 and 67, respectively. In this example, the data transmission is via a "Burst Data Load ('4Xh' or '5Xh')". Without additional command assertion to the flash memory devices 64 and 67 after the 'Burst Data Load' command, the page buffers 66 and 69 hold the data in latches. After transmitting the data to the designated devices 64 and 67, the flash memory controller 61 switches the contents of the data storage elements 63 in order to start a new operation, for example, a page program or a page read. At a later time, the data can be read from the page buffers 66 and 69 without programming the data into the memory cells 65 and 68 of the memory devices 64 and 67. The command "Burst Data Read ('2Xh')" is used for this purpose. The data processing unit 62 operates to perform the data processing for the memory controller 61. Subsequent examples also refer to a "data processing unit". It is to be understood that each data processing unit would include any appropriate circuitry for performing the data processing described for the example.

There are two cases where data is transmitted from the flash memory controller 61 to the two memory devices 64 and 67. A first case is that different data is transmitted to the memory devices. A second case is that the same data is transmitted to the memory devices 64 and 67. The data transfers of the first and second cases are shown in FIGS. 4A and 4B, respectively.

Figure 4A:
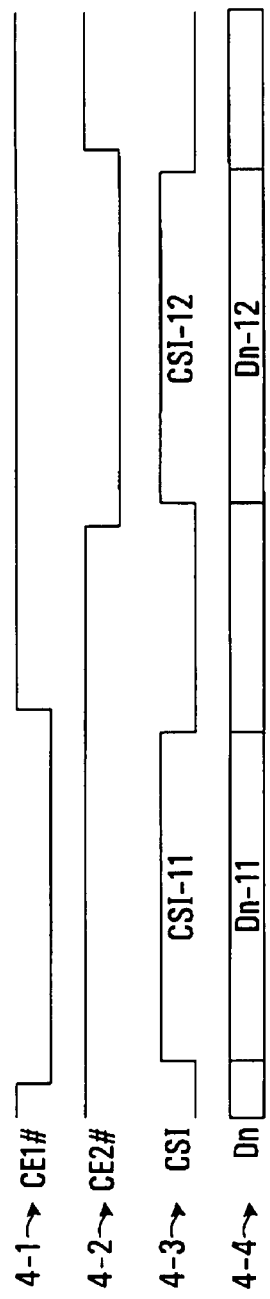
FIGS. 4A and 4B are example timing diagrams for a data transfer in the memory system shown in FIG. 3.

Referring to FIGS. 3 and 4A, the flash memory controller 61 sends a chip enable signal (CE1#) as indicated at 4-1 to the first memory device 64 to enable it. Also, the flash memory controller 61 sends another chip enable signal (CE2#) as indicated at 4-2 to the second memory device 67 to enable it. While the CE1# is "low" and the CE2# is "high", only the first memory device 64 is enabled, so that the first memory device 64 is designated. Then, a command strobe input (CSI) as indicated at 4-3 is asserted (as indicated by CSI-11), and a data input (Dn) as indicated at 4-4 transfers from the data storage elements 63 of the flash memory controller 61 to the page buffer 66 of the first memory device 64 via the common bus 70. The data input Dn contains burst data load, column address and data (as indicated by Dn-11). While the CE1# is "high" and the CE2# is "low", only the second memory device 67 is enabled, so that the second memory device 67 is designated. Then, the CSI is asserted (as indicated by CSI-12), the Dn transfers from the data storage elements 63 of the flash memory controller 61 to the page buffer 69 of the second memory device 67 via the common bus 70. The data input Dn contains burst data load, column address and data (as indicated by Dn-12).

Figure 4B:
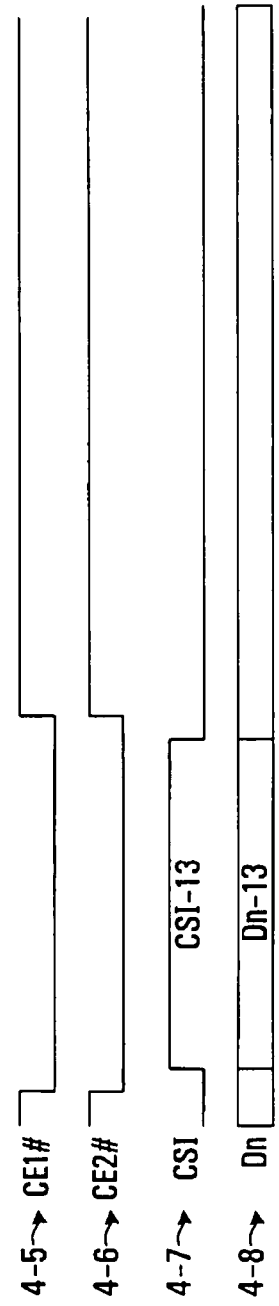

Referring to FIGS. 3 and 4B, the flash memory controller 61 sends the CE1# as indicated at 4-5 and CE2# as indicated at 4-6 to the first and second memory devices 64 and 67, respectively. When the CE1# and CE2# are "low" at the same time, the first and second memory devices 64 and 67 are simultaneously enabled. Then, the CSI as indicated at 4-7 is asserted (as indicated by CSI-13), and the data input (Dn) as indicated at 4-8 transfers from the data storage elements 63 of the flash memory controller 61 to the page buffers 66 and 69 of the first and second memory devices 64 and 67 simultaneously via the common bus 70 (as indicated by Dn-13).

Alternatively, the memory system having a multi-drop architecture shown in FIG. 3 can include more than two memory devices (N>2). In such a memory system, each memory device receives a chip enable signal in different timing. The memory device that receives a chip enable that is "low" is the designated memory device. In response to the command strobe input, data is transmitted to the designated memory device.

In another implementation including more than two memory devices (N>2), the chip enable with a "low" state is sent to all memory devices to enable them simultaneously. Thus, all memory devices are simultaneously designated. In response to the command strobe input, data is transmitted to all memory devices.

Figure 5:
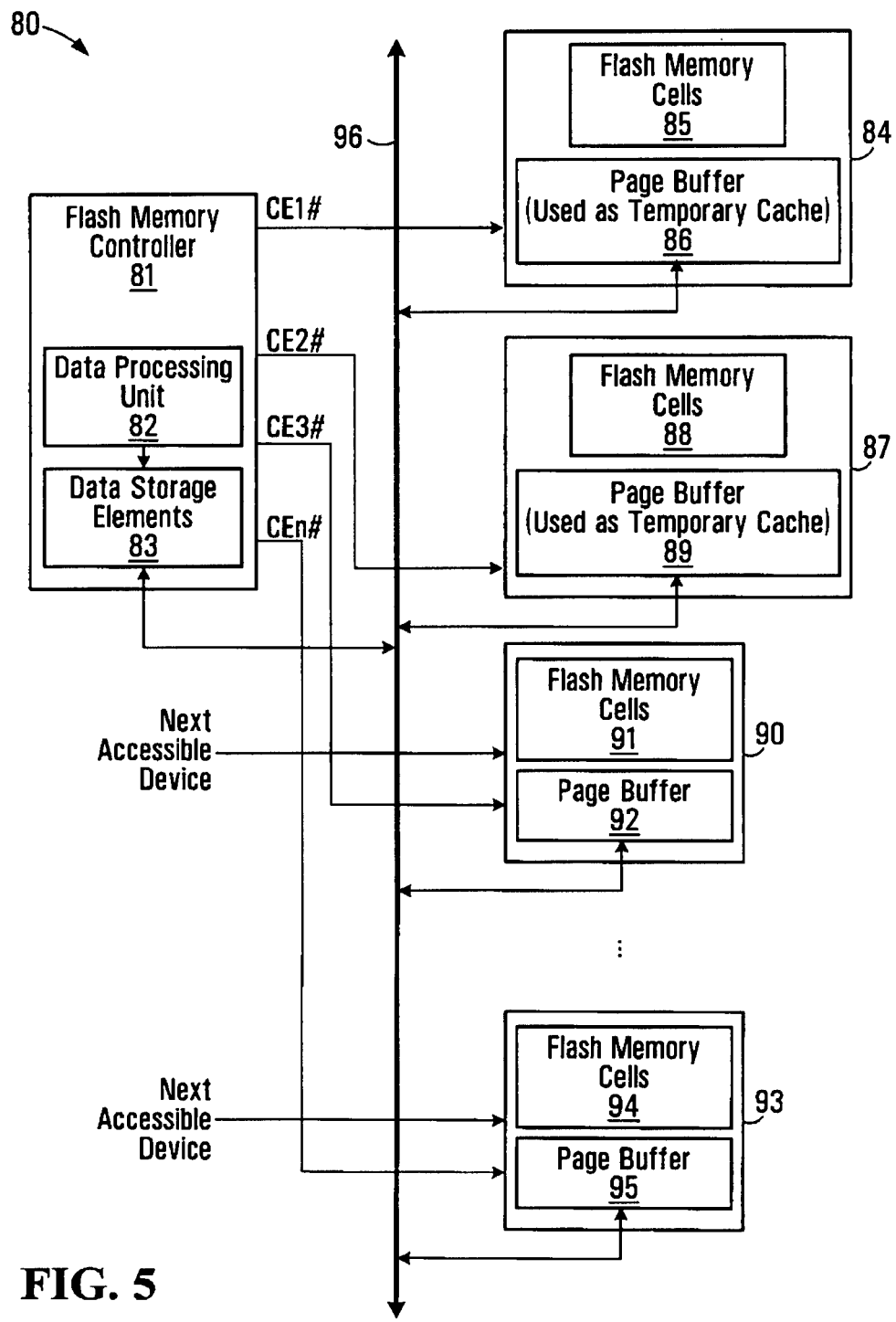
FIG. 5 is a block diagram of a memory system having a multi-drop architecture in which memory devices are accessible after the data transfer.

FIG. 5 shows another example of a memory system 80 having a multi-drop architecture. Referring to FIG. 5, the memory system 80 having a multi-drop architecture includes a flash memory controller 81 and a plurality (n) of memory devices 84, 87, 90, - - - , and 93. The flash memory controller 81 has a data processing unit 82 and data storage elements 83. The memory devices 84, 87, 90, - - - , and 93 have flash memory cells 85, 88, 91, - - - , and 94, respectively, and page buffers 86, 89, 92, - - - , and 95, respectively. The flash memory controller 81 interconnects with the memory devices 84, 87, 90, - - - , and 93 via a common bus 96.

In the example illustrated in FIG. 5, it is assumed that the page buffers 86 and 89 of the two memory devices 84 and 87 are being used as temporary caches 86 and 89 for data. Because of this, these memory devices 84 and 87 are "inaccessible". This is because for either a read or write operation, the page buffers 86 and 89 will be needed, but for now they are not available. The other memory devices 90, - - - , and 93 are considered "accessible" devices because the page buffers 92, - - - , and 95 of the memory devices 90, - - - , and 93 are not currently being used as temporary caches. Therefore, read or write operations or other temporary caching operations to the memory devices 90, - - - , and 93 can be performed. The contents of the temporary caches (the page buffers 86 and 89) can be changed at any time, or modified in part or in whole depending on the flash memory controller 81. If the temporary caches by the page buffers 86 and 89 are unnecessary, then they can be used as page buffers like the other page buffers 92, - - - , and 95.

Figure 6:
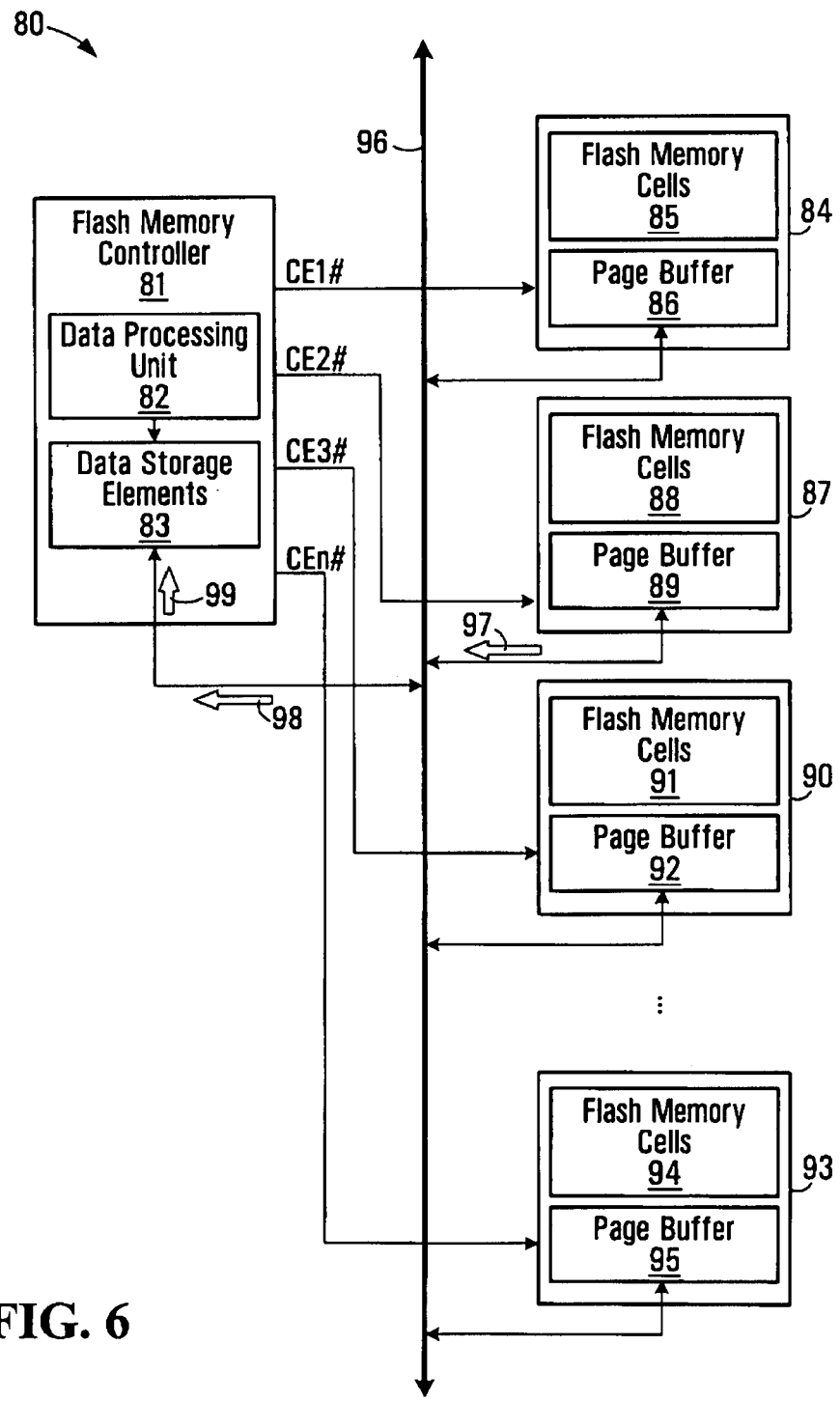
FIG. 6 is a block diagram of the memory system of FIG. 5 in which a data recovery from a temporary cache is performed.

FIG. 6 shows the data recovery from the temporary cache of the memory system 80 shown in FIG. 5. In the particular example shown in FIG. 6, the data is read from the temporary cache 89 of the second memory device 87 to the data storage elements 83 of the flash memory controller 81. A data recovery path includes data paths as indicated at 97, 98 and 99. The data is read out using the command "Burst Data Read ('2Xh')". The flash memory controller 81 sends chip enable (CE1#, CE2#, CE3#, - - - , and CEn#) to the memory devices 84, 87, 90, - - - , and 93, respectively, to enable them. The data recovery from the temporary cache in the memory system 80 is shown in FIG. 7.

Figure 7:
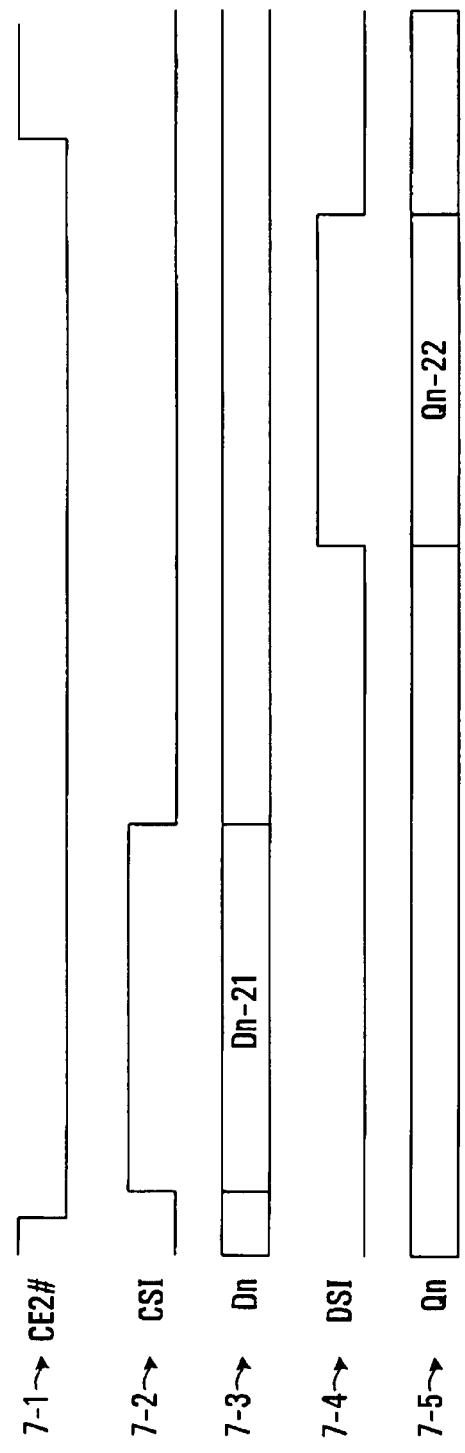
FIG. 7 is an example timing diagram for the data recovery from the temporary cache in the memory system shown in FIG. 6.

Referring to FIGS. 6 and 7, while the CE2# is "low" as indicated at 7-1, a command strobe input (CSI) is "high" as indicated at 7-2, so that the Dn containing burst data read and column address (as indicated by Dn-21) is transferred from the data storage 83 of the flash memory controller 81 as indicated at 7-3. Thereafter, a data strobe input (DSI) is "high" as indicated at 7-4, so that data Qn containing data output from the temporary cache (as indicated by Qn-22) is read from the memory device 87 and transmitted to the data storage elements 83 of the flash memory controller 81 as indicated at 7-5.

Figure 8:
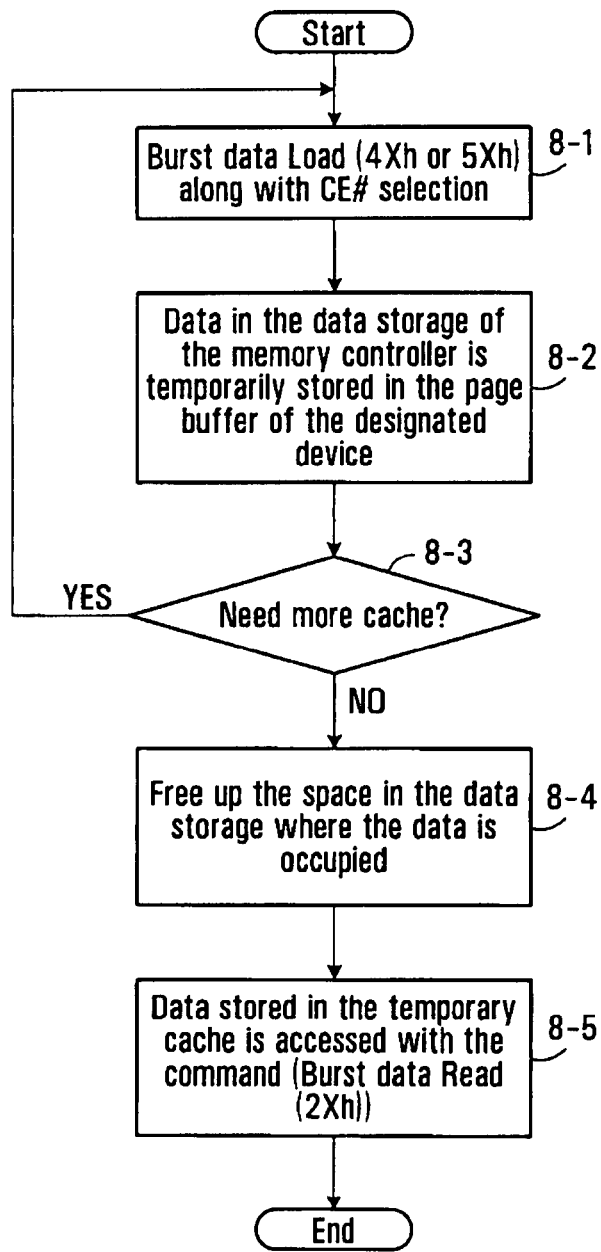
FIG. 8 is a flowchart of an example method for using a page buffer as a temporary cache in the multi-drop architecture.

FIG. 8 shows an example method of using a page buffer as a temporary cache in a multi-drop architecture. This method can be implemented in a memory controller, for example by the memory controller 81 shown in FIGS. 5 and 6.

Referring to FIGS. 5 and 8, the flash memory controller 81 issues the command "Burst Data Load ('4Xh' or '5Xh')" with data and controls the CE# selection for enabling a selected memory device, for example, the second memory device 87 (step 8-1). The data stored in the data storage elements 83 of the flash memory controller 81 is written to the page buffer 89 of the selected memory device 87 (step 8-2). If more cache is needed (YES at step 8-3), then processing of steps 8-1 and 8-2 continues, so that more data can be loaded into the page buffers of the other memory devices. However, if no more cache is needed (NO at step 8-3), then the flash memory controller 81 frees up the space in the data storage elements 83 where the data is occupied (step 8-4). The freed up space can be used for other applications. Then, the flash memory controller 81 can access the data stored in the temporary cache (e.g., the page buffer 89 of the second memory device 87) using the command "Burst Data Read ('2Xh')", so that the temporarily stored data is read back to the data storage elements 83 of the flash memory controller 81 (step 8-5).

In some embodiments of the present invention, the memory systems described herein are implemented using a flexible modular command structure, example details of which have already been provided in Table 1. It is to be understood that the details provided in this section are very specific for example purposes only.

As described above, modular commands (for, e.g., NAND flash memory) can provide higher flexibility of utilizing multiple devices and/or multiple bank accesses than conventional NAND flash memory. Along with this, there is provided diverse utilization of a page buffer of each flash memory on a system. Therefore, if a system uses the modular command NAND flash system in accordance with an embodiment of the invention, the utilization range of a page buffer can be expanded to cache operations between non-volatile flash memories and/or flash memory controller and device.

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of the devices or apparatus. Thus, in actual configuration of devices and apparatus, the elements and circuits are directly or indirectly coupled with or connected to each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method for controlling a plurality of flash memory devices connected with a controller through a common bus, each of the plurality of flash memory devices having a page buffer and memory cells, the method comprising:
   selecting at least one accessible flash memory device of the plurality of flash memory devices by providing a first control signal to the selected at least one accessible flash memory device, the selected at least one accessible flash memory device being selected at least partially based on having an empty page buffer;
   writing data from a data storage of the controller to the page buffer of the selected at least one accessible flash memory device by providing a second control signal to the selected at least one accessible flash memory device; and
   reading back the data from the page buffer of the selected at least one accessible flash memory device to the data storage of the controller by providing a third control signal to the selected at least one accessible flash memory device, prior to programming the data from the page buffer into the memory cells of the selected at least one accessible flash memory device.

2. The method of claim 1, further comprising:
   freeing up space in the data storage where the data is occupied in response to writing the data from the data storage to the page buffer of the selected at least one accessible flash memory device.

3. The method of claim 2, wherein the writing data comprises:
   providing a data load command and the data to the selected at least one accessible flash memory device,
   wherein the page buffer of the selected at least one accessible flash memory device stores the data in the page buffer thereof in response to the data load command and the command strobe.

4. The method of claim 2, wherein the reading back comprises:
   enabling the selected at least one of the accessible flash memory device,
   wherein the data stored in the page buffer of the selected at least one accessible flash memory device is outputted to the data storage of the controller in response to the data strobe.

5. The method of claim 1, wherein the writing comprises:
   enabling a first memory device and a second memory device of the selected at least one accessible flash memory device;
   providing a data load command and the data to the first and second memory devices, the data being transmitted from the data storage of the controller; and providing a command strobe to the first and second memory devices;
wherein the respective page buffers of the first and second memory devices store the data in the page buffer thereof in response to the data load command and the command strobe.

6. The method of claim 5, wherein the providing the data load and the data comprises:
providing a first data load and first data and a second data load and second data.

7. The method of claim 6, wherein the providing the first data load and first data and the second data load and second data comprises:
providing the first and second data loads simultaneously, wherein the respective page buffers of the first and second memory devices store the first and second data, respectively.

8. The method of claim 6, wherein the providing the first data load and first data and the second data load and second data comprises:
providing the first data load and first data and the second data load and second data in different timing, wherein the respective page buffers of the first and second memory devices store the first and second data, respectively.

9. The method of claim 7, wherein the reading back comprises:
enabling the first and second memory devices;
providing a data strobe to the first and second memory devices, and
the data stored in the page buffers of the enabled first and second memory devices being outputted to the data storage of the controller in response to the data strobe.

10. The method of claim 8, wherein the reading back comprises:
enabling the first and second memory devices;
providing a data strobe to the first and second memory devices; and
the data stored in the page buffers of the enabled first and second memory devices being outputted to the data storage of the controller in response to the data strobe.

11. An apparatus for controlling a plurality of flash memory devices connected with a common bus, each of the memory devices having a page buffer and memory cells, the apparatus being configured to:
select at least one accessible flash memory device of the plurality of flash memory devices by providing a first control signal to the selected at least one accessible flash memory device, the selected at least one accessible flash memory device being selected at least partially based on having an empty page buffer;
write data from a data storage of the apparatus to the page buffer of the selected at least one accessible flash memory device of the plurality of flash memory devices by providing a second control signal to the selected at least one accessible flash memory device; and
read back the data from the page buffer of the selected at least one accessible flash memory device to the data storage by providing a third control signal to the selected at least one accessible flash memory device, prior to programming the data from the page buffer into the memory cells of the selected at least one accessible memory device.

12. The apparatus of claim 11, being further configured to:
free up space in the data storage where the data is occupied, in response to writing the data from the data storage to the page buffer of the selected at least one accessible flash memory device.

13. A system comprising:
a plurality of flash memory devices connected with a common bus, each of the memory devices having a page buffer and memory cells; and
a memory controller for controlling the plurality of memory devices, the memory controller being configured to:
select at least one accessible flash memory device of the plurality of memory devices by providing a first control signal to the selected at least one accessible flash memory device, the selected at least one accessible flash memory device being selected at least partially based on having an empty page buffer;
write data from a data storage of the controller to the page buffer of the selected at least one accessible memory device by providing a second control signal to the selected at least one accessible flash memory device; and
read back the data from the page buffer of the selected at least one accessible memory device to the data storage of the controller by providing a third control signal to the selected at least one accessible flash memory device, prior to programming the data from the page buffer into the memory cells of the selected at least one accessible memory device.

14. The system of claim 13, wherein the memory controller is further configured to:
free up space in the data storage where the data is occupied, in response to writing the data from the data storage to the page buffer of the selected at least one accessible memory device.

15. The system of claim 13, wherein each device of the plurality of memory devices comprises a flash memory device.

16. The system of claim 15, wherein each flash memory device comprises a NAND flash device.

* * * * *